United States Patent
Anand et al.

(10) Patent No.: US 9,779,783 B2
(45) Date of Patent: Oct. 3, 2017

(54) LATCHING CURRENT SENSING AMPLIFIER FOR MEMORY ARRAY

(71) Applicant: INTERNATIONAL BUSINESS MACHINES CORPORATION, Armonk, NY (US)

(72) Inventors: Darren L. Anand, Williston, VT (US); John A. Fifield, Underhill, VT (US); Eric D. Hunt-Schroeder, South Burlington, VT (US); Mark D. Jacunski, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/744,800

(22) Filed: Jun. 19, 2015

(65) Prior Publication Data

US 2016/0372164 A1 Dec. 22, 2016

(51) Int. Cl.
*G11C 7/06* (2006.01)
*G11C 17/18* (2006.01)

(52) U.S. Cl.
CPC .............. *G11C 7/065* (2013.01); *G11C 17/18* (2013.01); *G11C 2207/063* (2013.01)

(58) Field of Classification Search
CPC ........... G11C 7/065; G11C 7/067; G11C 7/08; G11C 17/123; G11C 17/126; G11C 17/12; G11C 17/165; G11C 17/146; G11C 2207/063
See application file for complete search history.

(56) References Cited

U.S. PATENT DOCUMENTS

| | | | |
|---|---|---|---|
| 4,796,230 A | 1/1989 | Young | |
| 4,965,468 A | 10/1990 | Nicollini et al. | |
| 5,255,233 A | 10/1993 | Izumi | |
| 5,467,267 A | 11/1995 | Okino | |
| 5,867,423 A | 2/1999 | Kapoor et al. | |
| 6,885,600 B2 | 4/2005 | Tran et al. | |
| 7,038,936 B2 | 5/2006 | Seevinck et al. | |
| 7,995,411 B2* | 8/2011 | Wilson | G11C 7/065 365/205 |
| 8,432,751 B2 | 4/2013 | Hafez et al. | |
| 8,872,586 B2 | 10/2014 | Hsieh | |
| 9,111,623 B1* | 8/2015 | Jung | G11C 11/1673 |
| 9,171,589 B2* | 10/2015 | Kim | G11C 7/222 |
| 9,460,760 B2* | 10/2016 | Jayaraman | G11C 7/065 |
| 2011/0235449 A1* | 9/2011 | Chen | G11C 7/00 365/207 |
| 2012/0300566 A1 | 11/2012 | Mueller et al. | |

OTHER PUBLICATIONS

Loehlein et al., "Dense Sense Amplifier/Latch Combination", IBM TDB, Oct. 1, 1986, pp. 2160-2161.*
Critchlow, DL, "Sense Amplifier for IGFET Memory", IBM TDB, Nov. 1, 1970, pp. 1720-1722.*

* cited by examiner

*Primary Examiner* — Andrew Q Tran
(74) *Attorney, Agent, or Firm* — Anthony Canale; Andrew M. Calderon; Roberts Mlotkowski Safran Cole & Caleron P.C.

(57) ABSTRACT

A latching current sensing amplifier circuit for memory arrays and a current sensing technique using the latching current sensing amplifier circuit are provided. The current sense-amplifier circuit includes a first and second pair of series connected transistors configured with a common gate node for a sense operation and reconfigurable as a cross-coupled pair for a latching operation.

15 Claims, 4 Drawing Sheets

US 9,779,783 B2

LATCHING CURRENT SENSING AMPLIFIER FOR MEMORY ARRAY

FIELD OF THE INVENTION

The invention relates to semiconductor structures and, more particularly, to a latching current sensing amplifier circuit for memory arrays and a current sensing technique using the latching current sensing amplifier circuit.

BACKGROUND

In conventional techniques, a programmable twin-cell read only memory array (PROM) with a 10-mv Vt difference in cell "signal" cannot be sensed by a voltage sense system without adjusting the wordline level around from 0.3 to 0.5 volts as Vt and process vary. Predicting where to set the wordline level, though, is not possible which poses a severe problem.

SUMMARY

In an aspect of the invention, a current sense-amplifier circuit comprises a first and second pair of series connected transistors configured with a common gate node for a sense operation and reconfigurable as a cross-coupled pair for a latching operation.

In an aspect of the invention, a circuit comprises: a first pair of p-type transistors (PFETs) connected in series; a second pair of PFETs connected in series; a first PFET of the first pair of PFETs and a second PFET of the second pair of PFETs are cross coupled by a common node; and a second PFET of the first pair of PFETs and a first PFET of the second pair of PFETs are cross coupled by the common node.

In an aspect of the invention, a method comprises: injecting a first pair of currents into a true bitline (BLT) and a complement bitline (BLC) connected to a storage cell, wherein the first pair of currents is self biased; drawing a second pair of currents out of the BLT and the BLC to provide gain and a voltage output; and once initial current sensing is complete, disconnecting the self-bias and latching transistors with a common node enabled by a latching signal to form a cross-coupled latch. The sensing and latching is controlled by a single digital input, and signal margining is done by differential adjustment of the second pair of currents.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to a latching current sensing amplifier circuit for memory arrays and a current sensing technique using the latching current sensing amplifier circuit. In embodiments, the latching current sensing amplifier circuit provides a current sensing and amplification technique for a programmable read only memory array (PROM), where a logic state is written into a twin-cell by altering the Vt of a FET in the memory cell. Advantageously, the current sensing technique provides an accurate sensing method across process, voltage and temperature (PVT) and has advantages over conventional voltage sensing techniques.

In more specific embodiments, the latching current sensing amplifier circuit implements a current sensing technique which injects a first pair of currents into True and Complement bitlines (BLT, BLC) connected to a storage cell, e.g., differential memory cell. The first pair of currents is self biased to improve operation over an extended range of common-mode cell current. A second pair of currents is drawn out of the bitlines (BLT, BLC) to provide gain and a voltage output. Once initial current sensing is complete, the self-biased wiring is disconnected and FETs of the latching current sensing amplifier circuit are reconfigured to form a cross-coupled latch. The sensing/latching operation is controlled by a single digital input, and signal margining is done by differential adjustment of the second pair of currents. The second pair of currents is derived from an on-chip bandgap source. In this way, differential current inputs are amplified and translated to latched digital voltage levels.

Figure 1:
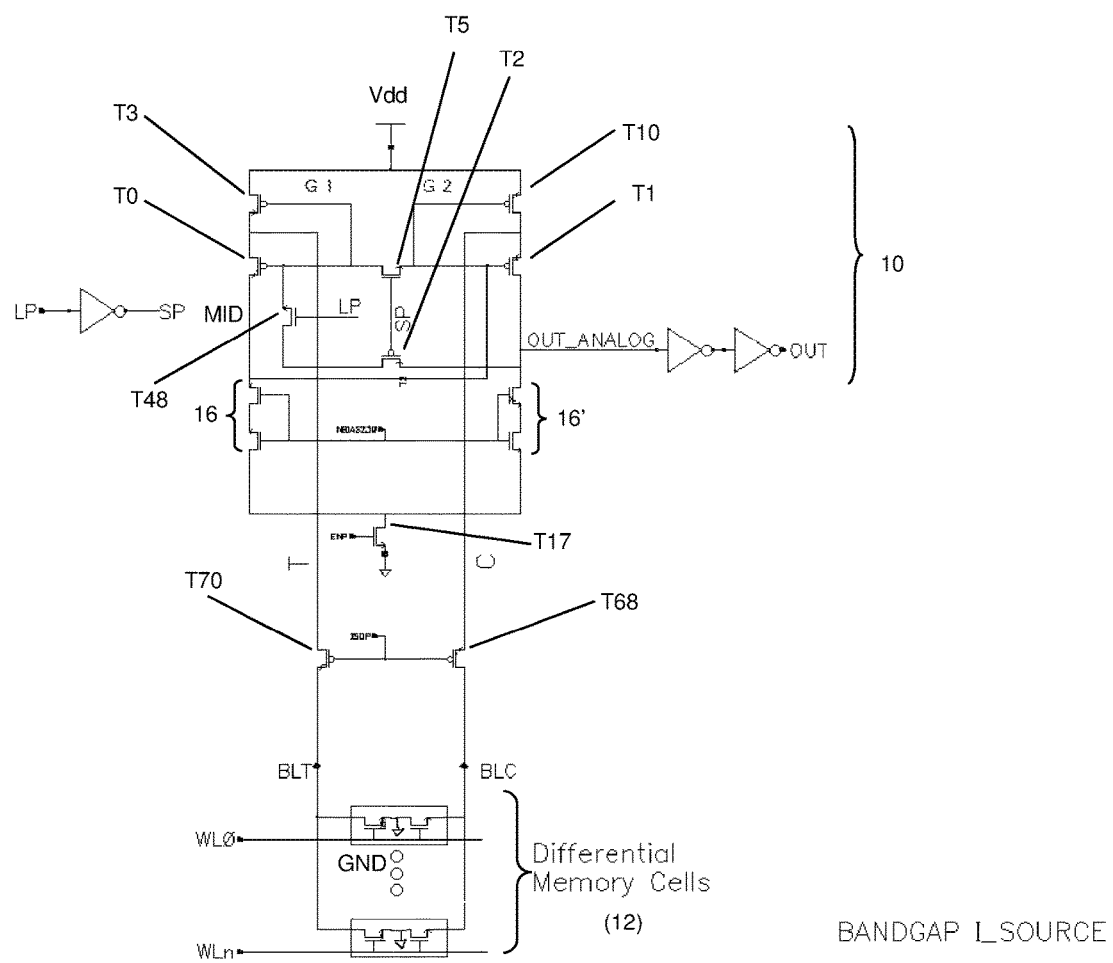
FIG. 1 shows a schematic diagram of a latching current sensing amplifier circuit in accordance with aspects of the invention.

FIG. 1 shows a schematic diagram of a latching current sensing amplifier circuit 10 in accordance with aspects of the invention. In embodiments, the latching current sensing amplifier circuit 10 includes two modes: sensing mode and latching mode. For example, in the sensing mode operation, e.g., LP=0 (SP=1), the circuit 10 will sense a differential current from a differential memory cell 12, e.g., a differential current between BLT and BLC, and amplify the result on an OUT node (e.g., OUT_ANALOG node); whereas, in the latching mode, e.g., LP=1 (SP=0), the circuit 10 will discontinue sensing the BLT and BLC and will convert the differential current into a full digital '1' or '0' voltage level e.g., a Vdd-level "1" or a ground-level "0". That is, the voltage differential is amplified and latched to provide a full digital output level. After the result is latched, an ISOP=1 signal will be set, which will isolate the circuit 10 from the differential memory cell 12 (using isolation transistors T68, T70). By isolating the circuit 10 from the differential memory cell 12, it is possible to prevent changes to the result.

More specifically, the latching current sensing amplifier circuit 10 includes power source, Vdd, coupled to transistors T3 and T10. In embodiments, a current path is established to the differential memory cells 12 through transistors T3 and T10 and node T and node C, respectively. In this configuration, transistors T3 and T10 can inject a current into the BLT and BLC. The current can also be injected into transistors T0 and T1, which are in series with transistors T3 and T10, respectively. In embodiments, transistors T0, T1, T3, and T10 are PFETs.

In more specific embodiments, the pair of series connected FETs, e.g., T3/T0 and T10/T1, are configured with a common gate node for a sense operation and subsequently reconfigured as a cross-coupled pair for a latching operation as further described herein. Specifically, the pair of series connected transistors comprises a first pair of series transistors e.g., transistors T10/T1, and a second pair of series connected transistors, e.g., transistors T3/T0. The serially arranged transistors each includes a common-gate node, G1 and G2, respectively, connecting to transistor T5. Also, each of the pair of series transistors e.g., transistors T10/T1 and transistors T3/T0, have a common output drain node, an intermediate node, e.g., coupled to nodes C and T, respectively, and an input-source node coupled to Vdd.

Still referring to FIG. 1, transistor T48 is coupled to latching signal LP and sensing signal SP is coupled to gates of transistors T2 and T5. Transistors T48 and T2 are arranged in series. Transistor T17 is an enable device, and is activated by the enable signal ENP and provides a connection to GND during the sensing and latching operation. In embodiments, transistor T2 is a PFET and transistors T5 and T48 are NFETs.

The circuit 10 further includes a pair of stacked transistors 16 and 16' which can pull a differential current from the differential memory cells 12 through BLT and BLC to OUT_ANALOG. More specifically, the stacked transistors 16 and 16' are NFETs arranged in series. In operation, for example, the stacked transistors 16' pull the current flowing out of node C and the stacked transistors (NFETs) 16 pull the current flowing out of node T. The currents passing through the stacked transistors 16, 16' will also pass through respective transistors T0 and T1 of the circuit 10.

The circuit 10 is coupled to the differential memory cells 12 by BLT and BLC though isolation devices T68 and T70. The isolation devices T68 and T70 can isolate the circuit 10 from the differential memory cell 12 to prevent any changes to the value of the latched result, as described herein. Also, as should be understood by those skill in the art, the differential memory cells 12 are controlled (e.g., enabled or activated) by respective wordlines, WL0, ... , WLn, with each differential memory cell 12 having a pair of transistors with their outputs to BLT and BLC. The transistors for each of the differential memory cells 12 have a different Vt, each of which are also connected to GND.

In a sensing mode operation, e.g., LP=0, SP=1, transistor T5 is enabled, e.g., turned on, to selectively short gates of transistors T3/T0 to gates of transistors T10/T1. In the latching mode, e.g., LP=1, SP=0, transistor T2 and T48 are enabled and the sensed voltage differential is amplified and latched to provide a full digital output level. By way of more specific example, transistors T3 and T10 inject a first current into the BLT and BLC. The first current source can also be injected into transistors T1 and T0. A second current is drawn out of the BLT and BLC (from the enabled differential memory cell) by NFET current sources, e.g., stacked NFETS 16, 16', and through nodes OUT_ANALOG and MID, respectively. In the sensing mode, the PFET gates (e.g., gates of T1, T3, T3 and T10) are connected to the MID node to form self biased current sources. Initially, the differential memory cells are not accessed and there are no bitline currents so the amplifier nodes, e.g., T and C, are in equilibrium with the BLT and BLC nodes. In one non-limiting example, nodes MID and ANALOG_OUT are equal at about 0.5V for a Vdd=0.9.

When a (0) storage cell (e.g., differential memory cell 12) is accessed with a high Vt on the BLT and a lower Vt on the BLC, node MID falls, e.g., to about 0.3 V, in response to the common-mode current into the differential memory cell 12. The T and C nodes within the amplifier have a small voltage differential leaving node T higher, e.g., about 70-mv higher, than node C, for a cell Vt difference of, e.g., about 35-mv. Output, Vgs, of transistor T1 is at cutoff at about, e.g., 215 mv, which allows current sources of NFET stack 16' to bring OUT_ANALOG toward ground. A difference of, e.g., −280-mv, exists on V(MID-ANALOG_OUT) when sensing mode is complete.

On the other hand, when a (1) storage cell is accessed with a high Vt on the BLC and a lower Vt on the BLT, node MID falls, e.g., to about 0.275 V, in response to the common-mode current into the differential memory cells 12. Now, T and C node have a reversed differential of about, e.g., −65-mv. The output FET T1 has a conducting bias condition with Vgs of about 430-mv, which produces enough current to overcome the NFET current sources (e.g., from the stacked transistors 16') to bring OUT_ANALOG to about, e.g., 0.7V. A difference of, e.g., about +409-mv exists on V(MID-ANALOG_OUT) when sensing mode is complete. Where V(X-Y) represents the difference in voltages of two respective nets, X and Y. Once the sense current is amplified and converted to a differential voltage signal on V (MID-ANALOG_OUT), the LP signal is activated and the latching current sensing amplifier circuit 10 is reconfigured as a cross coupled latch to provide full 0V and Vdd digital logic levels. The ANALOG_OUT node can be buffered to drive a larger load.

Figure 2:
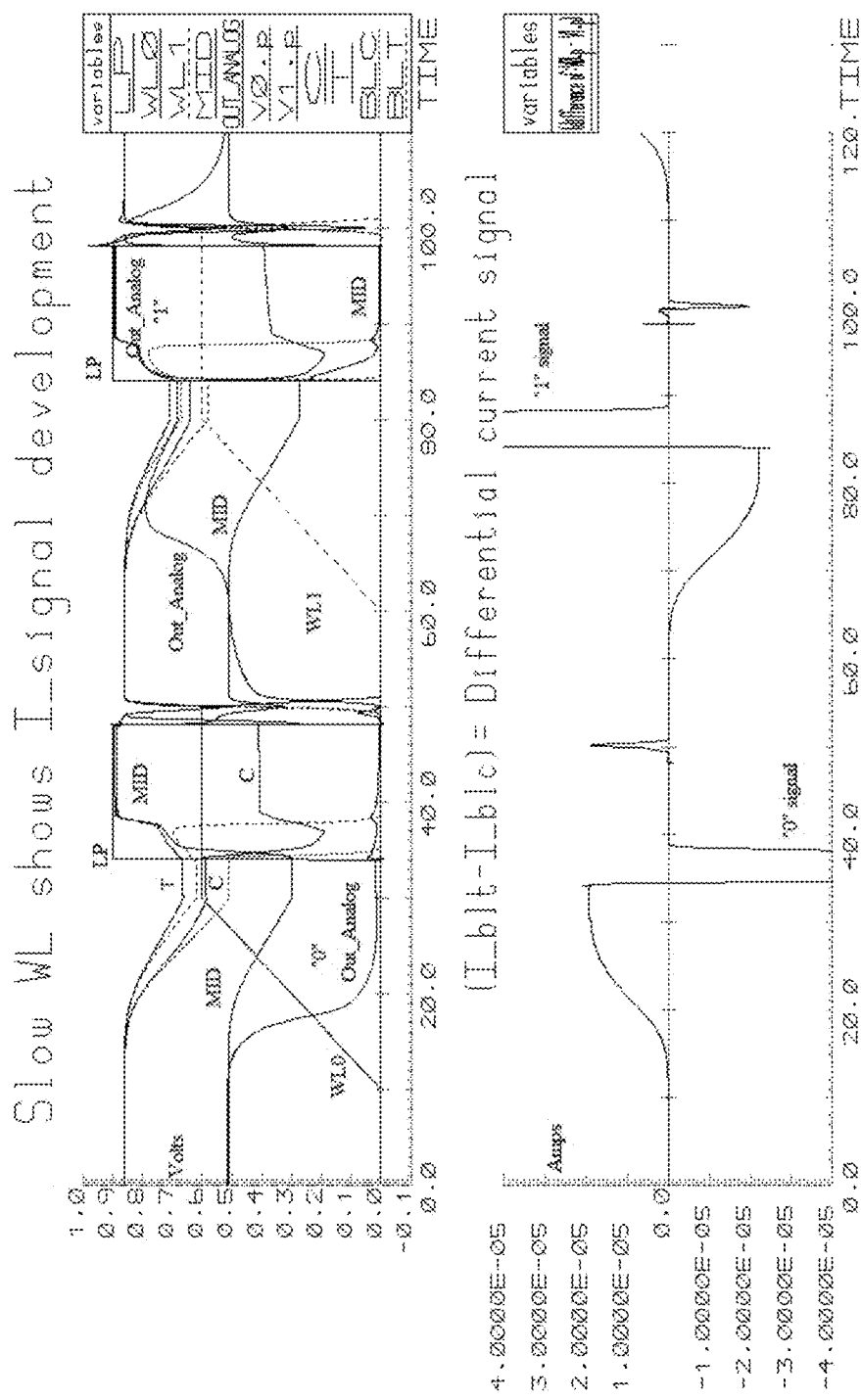
FIG. 2 shows a simulation with a cell VTADDER of +/−35 mv in accordance with aspects of the present invention.

FIG. 2 shows a simulation with a cell VT adder (VTADDER) of +/−35 mv in accordance with aspects of the present invention. In this simulation, the wordline level is shown as a slow ramp to illustrate there is a wide range of acceptable wordline levels, over which adequate levels of sense signal are available. In embodiments, an optimum wordline level is about Vdd-0.3; however reliable sensing can be realized over a wide range of wordline voltages.

Figure 3A:
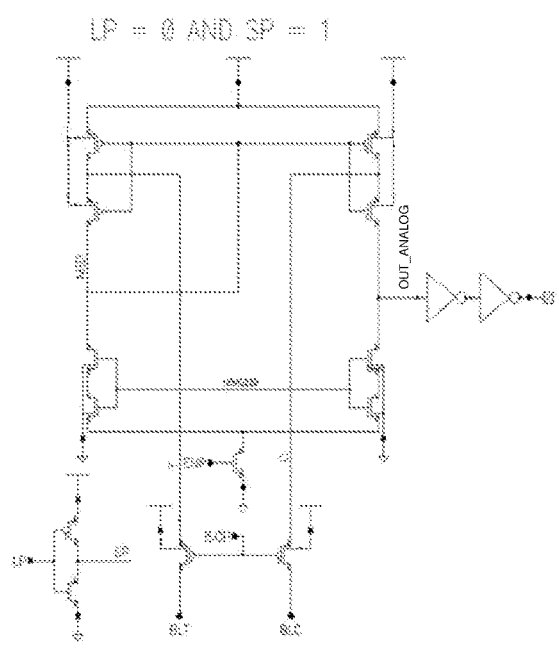
FIGS. 3a and 3b show schematics of two modes of operation based on input LP (LP=0 or LP=1).
Figure 3B:
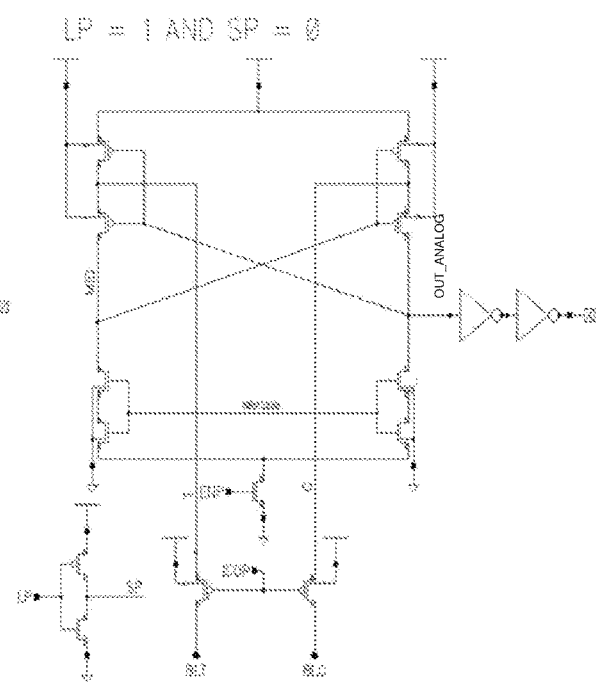

FIGS. 3a and 3b show schematics of two modes of operation based on input LP (LP=0 or LP=1). FIG. 3a shows a first mode of operation configured as a current-sense mode and FIG. 3b shows a second mode of operation configured as a cross-coupled latch. More specifically, FIG. 3a shows the effective equivalent connection diagram of the sense and latch circuit when configuration input LATCHP=0. LATCHP is equivalent to the input LP. In this first mode of operation, the series connected PFET pairs T10/T1 connected between Vdd and node OUT_ANALOG, and the series connected PFET pairs T3/T0 between Vdd and node MID are configured with a common gate connection further connected to node MID. This places the series connected PFET pairs in a self-biased mode which can respond to the current demands of a storage cell connected to nodes BLT and BLC. This first mode of operation is used in a sensing operation in which the digital data encoded in a differential storage cell as a threshold difference between a pair of FETs is sensed and converted to a differential voltage.

FIG. 3b shows the effective equivalent connection diagram of the sense and latch circuit when configuration input LATCHP=1. In this mode, the small differential voltage signal developed on nodes OUT_ANALOG and MID is amplified and latched to provide a full rail logic level. Sense amp nodes are isolated from the BLT and BLC lines in this mode by switching the isolator FETs off. When LATCHP=1, the series connected PFETS T3/T0 connected between Vdd and node MID and the series connected PFETS T10/T1 connected between Vdd and node OUT_ANALOG are cross coupled. That is, node OUT_ANALOG connects to the gate of the series connected PFETs T3/T0 between Vdd and MID and node OUT_ANALOG connects to the gates of series connected PFETs T10/T1 between Vdd and node MID. When the LATCHP signal is switched from its previous "sense-mode" condition to the "latch-mode" condition the small differential voltage between nodes MID and OUT_ANALOG are amplified by the current conduction through the NFET stacked devices 16, 16' to GND. If node OUT_ANALOG starts out higher than node MID, the current conduction will further this difference and force node MID to ground Likewise, if node MID starts out higher, the current conduction will force node OUT_ANALOG to ground. Full rail digital signals are available at node OUT_ANALOG in both data polarities.

Figure 4:
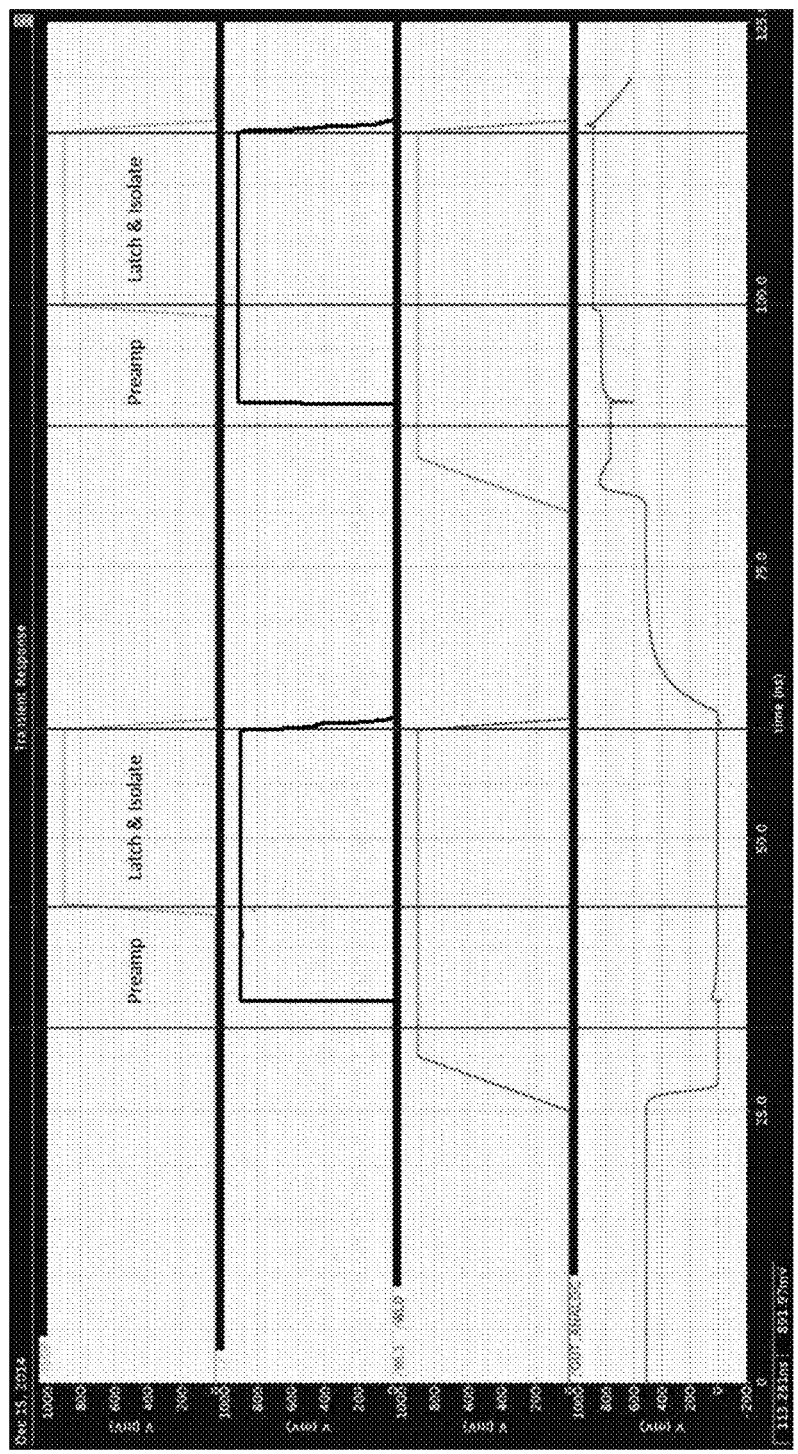
FIG. 4 shows a transient simulation showing modes of operation in accordance with aspects of the present invention.

FIG. 4 shows a transient simulation showing modes of operation in accordance with aspects of the present invention. In particular, FIG. 4 shows four plots: the first plot shows ISOP (isolate signal), the second plot shows LP (LATCHP) (latch when LP=1), the third plot shows two WLs, one configured to produce a logic "0" and the other to produce a logic "1", and the fourth plot shows an output node throughout the transient simulation. As shown in these plots, when WL=1 and LP=0, the output node drifts towards its logic state of 0 or 1. Then bringing LP high (LP0->1) and latching the result, the output node is either a 0 or a 1. Finally, when ISOP0->1, the circuit 10 is isolated from the memory bit cell. Under latch and isolation condition, a strong "1" or "0" is produced based on the differential currents in BLT and BLC.

It should be noted that in conventional techniques, a PROM with a 10-mv difference in cell "signal" cannot be sensed by a voltage sense system without adjusting the wordline level around from 0.3 to 0.5 volts as Vt and manufacturing process conditions vary. It is not possible, though, to predict where to set the wordline level, which results in a severe problem. In contrast, the circuit 10 described herein is highly operable over a wide wordline range, e.g., wordline level of 0.3 volts to 0.7 volts. In the circuit 10, the signal is largely invariant over PVT and a latch signal of hundreds of millivolts is generated with about 100 µa of differential bitline signal. Wordline voltage is ramped up slowly to compare differential voltage-signal for a voltage sensing system, to the differential current-signal in the circuit 10. Moreover, by implementing the circuit 10 described herein the differential current-sense signal is broader and the exact wordline voltage is not as critical to achieve an operable signal level. In fact, wordline voltage regulation requirements are not as critical using current-sensing, e.g., the circuit 10 described herein.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A current sense-amplifier circuit comprising:
a first pair of series connected transistors; and
a second pair of series connected transistors,
wherein the first pair of series connected transistors and the second pair of series connected transistors are configured with a common gate node and
wherein the first pair of series connected transistors and the second pair of series connected transistors are configured for a sense operation and reconfigurable as a cross-coupled pair for a latching operation.

2. The current sense-amplifier circuit of claim 1, wherein the first pair of series connected transistors and the second pair of series connected transistors are wired as a self-biased circuit.

3. The current sense-amplifier circuit of claim 1, wherein the first pair of series connected transistors and the second pair of series connected transistors each further comprises, an output-drain node, an intermediate node, and an input-source node.

4. The current sense-amplifier circuit of claim 3, wherein the output-drain node for the first pair of series connected transistors and the output-drain node for the second pair of series connected transistors are connected to a pair of first current sources.

5. The current sense-amplifier circuit of claim 3, wherein the intermediate node for the first pair of series connected transistors and the intermediate node for the second pair of series connected transistors are connected to a pair of sense lines.

6. The current sense-amplifier circuit of claim 3, wherein the input-source node for the first pair of series connected transistors and the input-source node for the second pair of series connected transistors are connected to a power supply.

7. The current sense-amplifier circuit of claim 3, wherein in the sense operation, the common gate node for the first pair of series connected transistors and the second pair of series connected transistors is coupled together to the output-drain node, and
wherein in the latching operation, the common gate node is separated and the first pair of series connected transistors and the second pair of series connected transistors are reconfigured in a cross-coupled arrangement.

8. The current sense-amplifier circuit of claim 7, wherein the common gate node, in response to being enabled by a sense signal, selectively shorts gates of the first pair of series connected transistors to gates of the second pair of series connected transistors.

9. The current sense-amplifier circuit of claim 7, wherein a first transistor of each of the first pair of series connected transistors and the second pair of series connected transistors injects a first current into a bitline true (BLT) and a bitline complement (BLC).

10. The current sense-amplifier circuit of claim 9, wherein a second current is drawn out of the BLT and BLC from a differential memory cell by a pair of stacked transistors.

11. The current sense-amplifier circuit of claim 10, wherein each of the first pair of series connected transistors and the second pair of series connected transistors is connected to a common node to form self biased current sources.

12. The current sense-amplifier circuit of claim 3, wherein the first pair of series connected transistors and the second pair of series connected transistors are p-type transistors (PFETs).

13. The current sense-amplifier circuit of claim 12, wherein a true bitline (BLT) of a differential memory cell is coupled at the intermediate node of the first pair of series connected transistors and a complementary bitline (BLC) of a differential memory cell is coupled at the intermediate node of the second pair of series connected transistors.

14. The current sense-amplifier circuit of claim 13, wherein the first pair of series connected transistors and the second pair of series connected transistors are each coupled in series to stacked transistors which pull a differential current from the differential memory cell through the BLT and BLC to OUT_ANALOG.

15. The current sense-amplifier circuit of claim 12, further comprising an isolation device to isolate the first pair of series connected transistors and the second pair of series connected transistors from a differential memory cell.

* * * * *